United States Patent
Lee et al.

(10) Patent No.: US 11,815,558 B2
(45) Date of Patent: Nov. 14, 2023

(54) APPARATUS AND METHOD FOR DIAGNOSING ABNORMAL DEGRADATED BATTERY CELL

(71) Applicant: LG ENERGY SOLUTION, LTD., Seoul (KR)

(72) Inventors: Hyun Chul Lee, Daejeon (KR); Dong Keun Kwon, Daejeon (KR); Sung Yul Yoon, Daejeon (KR); Seung Hyun Kim, Daejeon (KR); An Soo Kim, Daejeon (KR); Chae Bin Shin, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 75 days.

(21) Appl. No.: 17/615,646

(22) PCT Filed: Jul. 24, 2020

(86) PCT No.: PCT/KR2020/009802
§ 371 (c)(1),
(2) Date: Dec. 1, 2021

(87) PCT Pub. No.: WO2021/107323
PCT Pub. Date: Jun. 3, 2021

(65) Prior Publication Data
US 2022/0317196 A1   Oct. 6, 2022

(30) Foreign Application Priority Data
Nov. 28, 2019  (KR) .................. 10-2019-0156065

(51) Int. Cl.
*G01R 31/392*  (2019.01)
*G01R 31/396*  (2019.01)
(Continued)

(52) U.S. Cl.
CPC ....... *G01R 31/392* (2019.01); *G01R 31/3842* (2019.01); *G01R 31/396* (2019.01); *H02J 7/005* (2020.01); *H02J 7/0048* (2020.01)

(58) Field of Classification Search
None
See application file for complete search history.

(56) References Cited

U.S. PATENT DOCUMENTS

| | | | |
|---|---|---|---|
| 2004/0001996 | A1 | 1/2004 | Sugimoto |
| 2004/0251875 | A1 | 12/2004 | Kinoshita et al. |

(Continued)

FOREIGN PATENT DOCUMENTS

| | | | |
|---|---|---|---|
| CN | 108196190 A | 6/2018 | |
| CN | 109687548 A | 4/2019 | |

(Continued)

OTHER PUBLICATIONS

Extended European Search Report Application No. 20892272.4 dated Jul. 12, 2022.

(Continued)

*Primary Examiner* — Jas A Sanghera
(74) *Attorney, Agent, or Firm* — Birch, Stewart, Kolasch & Birch, LLP (57) ABSTRACT

The present disclosure relates to a battery management system and method for diagnosing abnormal deterioration of a battery cell, and provides the battery management system including an SOC calculation unit for calculating a state of charge (SOC) of a plurality of battery cells, a change amount calculation unit for calculating, for each of the plurality of battery cells, an SOC change amount that is a change amount of the calculated SOC during a preset period and an SOC change amount average that is an average of the SOC change amount of all the plurality of battery cells, and an abnormal deterioration diagnosis unit for diagnosing an (Continued)

abnormal deterioration of each of the plurality of battery cells using the SOC change amount and the SOC change amount average thereby accurately diagnosing abnormal deterioration of battery cells.

16 Claims, 10 Drawing Sheets

(51) Int. Cl.
  *G01R 31/3842* (2019.01)
  *H02J 7/00* (2006.01)

(56) References Cited

U.S. PATENT DOCUMENTS

| | | |
|---|---|---|
| 2011/0181246 A1 | 7/2011 | Tae et al. |
| 2012/0035873 A1 | 2/2012 | Kang et al. |
| 2012/0081075 A1* | 4/2012 | Skelton ............ B60L 58/15 180/65.29 |
| 2012/0086399 A1 | 4/2012 | Choi |
| 2012/0223677 A1* | 9/2012 | Yamauchi ............ H02J 7/34 320/134 |
| 2013/0049698 A1 | 2/2013 | Jung |
| 2015/0349387 A1* | 12/2015 | Inaba ............ H02J 7/0048 700/297 |
| 2016/0109522 A1 | 4/2016 | Kim et al. |
| 2017/0175708 A1 | 6/2017 | Roesmann |
| 2017/0236464 A1 | 8/2017 | Koshihara |
| 2017/0328957 A1* | 11/2017 | Suzuki ............ H01M 10/48 |
| 2018/0120385 A1 | 5/2018 | Choi |
| 2018/0149709 A1 | 5/2018 | Jo |
| 2019/0027784 A1 | 1/2019 | Nose |
| 2019/0033376 A1 | 1/2019 | Jeong et al. |
| 2019/0051231 A1 | 2/2019 | Koshihara |
| 2019/0195953 A1 | 6/2019 | Komiyama |

FOREIGN PATENT DOCUMENTS

| | | |
|---|---|---|
| JP | 2003-243042 A | 8/2003 |
| JP | 2004-31120 A | 1/2004 |
| JP | 2005-3414 A | 1/2005 |
| JP | 2008-8861 A | 1/2006 |
| JP | 2007-113953 A | 5/2007 |
| JP | 2010-114966 A | 5/2010 |
| JP | 2013-160539 A | 8/2013 |
| JP | 2015-158416 A | 9/2015 |
| JP | 2016-513249 A | 5/2016 |
| JP | 2017-110664 A | 6/2017 |
| JP | 2017-146372 A | 8/2017 |
| JP | 2018-55783 A | 4/2018 |
| JP | 2019-21515 A | 2/2019 |
| JP | 2019-114450 A | 7/2019 |
| KR | 10-2010-0019249 A | 2/2010 |
| KR | 10-2011-0087565 A | 8/2011 |
| KR | 10-2012-0037682 A | 4/2012 |
| KR | 10-2013-0024763 A | 3/2013 |
| KR | 10-2018-0060622 A | 6/2018 |
| KR | 10-2018-0082020 A | 7/2018 |
| KR | 10-2019-0011957 A | 2/2019 |
| KR | 10-1949449 B1 | 2/2019 |
| KR | 10-2035678 B1 | 10/2019 |
| WO | WO 2018/235496 A1 | 12/2018 |

OTHER PUBLICATIONS

International Search Report (PCT/ISA/210) issued in PCT/KR2020/009802, dated Oct. 28, 2020.

* cited by examiner

APPARATUS AND METHOD FOR DIAGNOSING ABNORMAL DEGRADED BATTERY CELL

MUTUAL CITATION WITH RELATED APPLICATIONS

The present invention claims the benefit of priority based on Korean Patent Application No. 10-2019-0156065 filed on Nov. 28, 2019, and includes all contents disclosed in the documents of the Korean patent application as part of this specification.

TECHNICAL FIELD

The present invention relates to an apparatus and method for diagnosing abnormal deterioration of battery cells.

BACKGROUND ART

Recently, with the spread of electronic devices such as smartphones and the development of electric vehicles, research on secondary batteries as a power source has also been actively conducted. The secondary battery is provided in the form of a battery pack including a battery module in which a plurality of battery cells are connected in series and/or in parallel, and a battery management system (BMS) that manages the operation of the battery module.

The battery management system monitors the state of the battery cell and determines whether an abnormality has occurred in the battery cell. Among them, the abnormal deterioration of the battery was diagnosed through State of Health (SOH), which is a parameter representing characteristics related to life, such as the capacity and resistance deterioration of the battery. However, the SOH value calculated through the existing modeling techniques and algorithms has an error of 5% or more when compared with the actual state. Therefore, the conventional diagnosis method using the SOH value as it is did not have high reliability in diagnosing abnormal deterioration of the battery. Actually, in the past, the SOH value was mainly used to check the trend of the state change of the battery cell.

DISCLOSURE

Technical Problem

The present invention has been made in consideration of such a problem, and an object of the present invention is to provide an apparatus and method for diagnosing battery cell abnormality deterioration, which has high reliability and does not significantly increase the complexity of the configuration compared to the conventional one.

Technical Solution

In order to solve the above technical problems, according to an aspect of the embodiments of the present disclosure, a battery management system (BMS) comprising: a state of charge (SOC) calculation unit configured to calculate a state of charge (SOC) of a plurality of battery cells; a change amount calculation unit configured to calculate, for each of the plurality of battery cells, an SOC change amount that is a change amount of the calculated SOC during a preset period and an SOC change amount average that is an average of the SOC change amount of all the plurality of battery cells; and an abnormal deterioration diagnosis unit configured to diagnose abnormal deterioration of each of the plurality of battery cells using the SOC change amount and the SOC change amount average.

According to another feature of this embodiment of the present disclosure, the abnormal deterioration diagnosis unit may diagnose a battery cell whose (SOC change amount/SOC change amount average) value is greater than or equal to a reference value as an abnormally deteriorated battery cell.

According to another feature of this embodiment of the present disclosure, the abnormal deterioration diagnosis unit may diagnose a battery cell that is maintained for more than a reference period with a (SOC change amount/SOC change amount average) value equal to or greater than the reference value as an abnormally deteriorated battery cell.

According to another feature of this embodiment of the present disclosure, the change amount calculation unit may calculate the SOC change amount and the SOC change amount average by using the SOC calculated by the SOC calculation unit during the standby period of the plurality of battery cells.

According to another feature of this embodiment of the present disclosure, the abnormal deterioration diagnosis unit may diagnose whether the battery cell is abnormally deteriorated regardless of voltages of the plurality of battery cells.

According to another feature of this embodiment of the present disclosure, the change amount calculation unit may calculate an SOC change amount due to self-discharge during the standby period as the SOC change amount.

According to another feature of this embodiment of the present disclosure, the change amount calculation unit periodically may calculate the SOC change amount and the SOC change amount average.

According to another feature of this embodiment of the present disclosure, the SOC calculation unit may include a voltage sensor for measuring a voltage of each of the plurality of battery cells, and the SOC calculation unit may calculate an SOC of each of the plurality of battery cells based on the voltage measured by the voltage sensor.

According to another feature of this embodiment of the present disclosure, the SOC calculation unit may include a current sensor that measures a current charged and discharged in the plurality of battery cells, and a timer that measures a time during which the current is charged and discharged, and the SOC calculation unit may calculate an SOC of each of the plurality of battery cells based on a current measured by the current sensor and a time measured by the timer.

In order to solve the above technical problem, according to an aspect of the embodiments of the present disclosure, a battery cell abnormal deterioration diagnosis method includes: calculating, by a battery management system (BMS), a state of charge (SOC) of a plurality of battery cells; calculating, by the BMS, for each of the plurality of battery cells, an SOC change amount that is a change amount of the calculated SOC during a preset period; calculating, by the BMS, an SOC change amount average that is an average of SOC change amounts of all of the plurality of battery cells; and diagnosing, by the BMS, whether each of the plurality of battery cells is abnormally deteriorated using the SOC change amount and the SOC change amount average.

According to another feature of this embodiment of the present disclosure, the diagnosing, by the BMS, whether each of the plurality of battery cells is abnormally deteriorated may include: calculating a (SOC change amount/SOC change amount average) value; comparing the calculated value with a reference value; and diagnosing a battery cell having the (SOC change amount/SOC change amount average) value equal to or greater than the reference value as an abnormally deteriorated battery cell.

Advantageous Effects

Due to the above configuration, it is possible to accurately diagnose abnormal deterioration of the battery cells.

BEST MODE

Hereinafter, various embodiments of the present invention will be described in detail with reference to the accompanying drawings. In this document, the same reference numerals are used for the same components in the drawings, and duplicate descriptions for the same components are omitted.

For various embodiments of the present invention disclosed in this document, specific structural or functional descriptions are exemplified only for the purpose of explaining an embodiment of the present invention, and various embodiments of the present invention may be implemented in various forms and should not be construed as being limited to the embodiments described in this document.

The terms such as "1st", "2nd", "first", "second", and the like used herein may refer to modifying various different elements of various embodiments of the present disclosure, but do not limit the elements. For example, a first component may be referred to as a second component and vice versa without departing from the technical scope of the present invention.

Terms used herein is for the purpose of describing particular example embodiments only and is not intended to be limiting of the scope of other embodiments. The terms of a singular form may include plural forms unless they have a clearly different meaning in the context.

Figure 1:
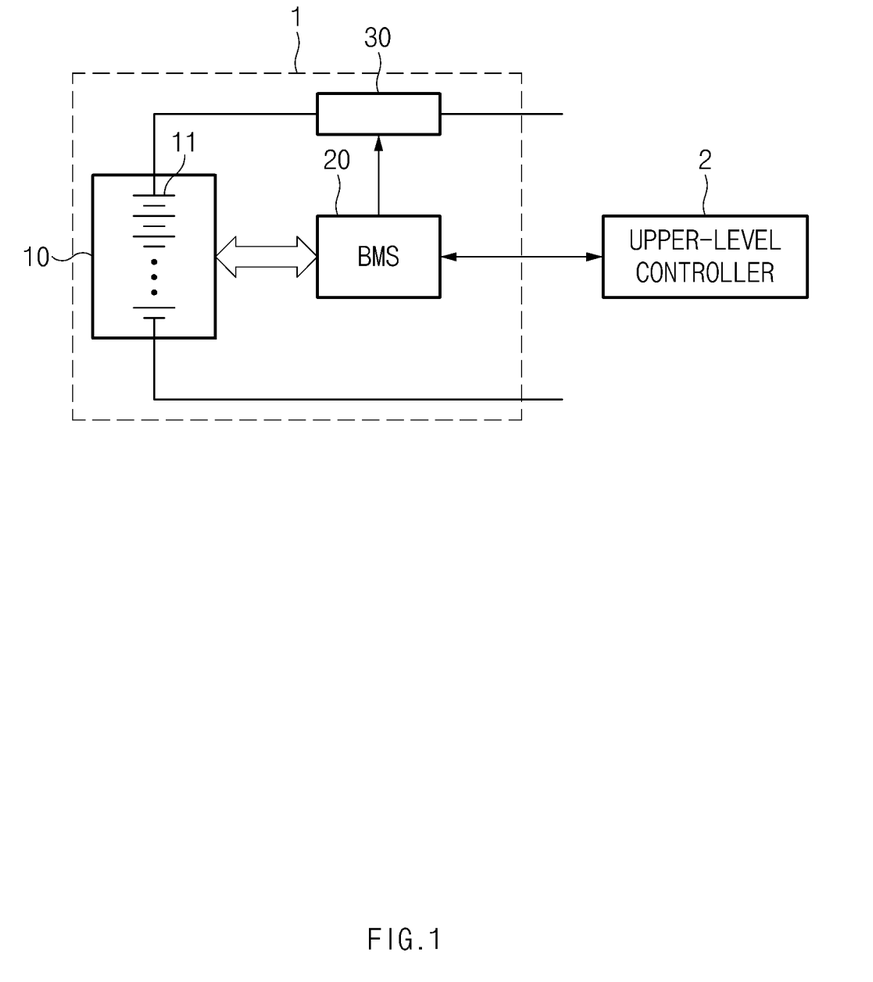
FIG. 1 is a view showing the configuration of a battery pack including a battery management system.

FIG. 1 is a view showing the configuration of a battery pack 1 including a battery management system 20.

Referring to FIG. 1, the battery pack 1 includes a battery module 10 composed of one or more battery cells and capable of being charged and discharged, a switching unit 30 (i.e., switch) connected in series to the positive (+) terminal side or the negative (−) terminal side of the battery module 10 to control the charge/discharge current flow of the battery module 10, and a battery management system 20 (hereinafter referred to as a 'BMS') that monitors the voltage, current, temperature, and the like of the battery cell and/or the battery module 10 to control and manage the prevention of overcharge and overdischarge.

The battery module 10 includes one or more battery cells 11 that can be charged and discharged. The battery cell 11 may be a lithium ion (Li-ion) battery, a lithium ion polymer (Li-ion polymer) battery, a nickel cadmium (Ni—Cd) battery, a nickel hydrogen (Ni-MH) battery, and the like, but is not limited thereto.

The BMS 20 may control the operation of the switching unit 30 to control charging and discharging of the battery module 10. In addition, the BMS 20 may monitor the voltage, current, temperature, and the like of the battery module 10 and/or each battery cell 11 included in the battery module 10. In addition, for monitoring by the BMS 20, sensors or various measurement modules may be additionally installed at any location of the battery module 10, or the charge/discharge path, or the battery pack 1. The BMS 20 may calculate parameters indicating the state of the battery module 10, for example, SOC or SOH, based on the measurement values of the monitored voltage, current, and temperature.

The BMS 20 controls and manages the overall operation of the battery pack 1. For this, the BMS 20 may include various components, such as a microcomputer, as a controller that executes a program and controls the overall operation of the BMS 20, input/output devices such as sensors and measurement means, and other peripheral circuits.

In addition, the BMS 20 may calculate the state of charge of each battery cell 11 and diagnose whether each battery cell 11 is abnormally deteriorated using the calculated state of charge. In particular, the BMS 20 according to the present embodiment may diagnose whether each battery cell is abnormally deteriorated based on the average of the change amount of the state of charge and the change amount of the state of charge of each of the plurality of battery cells 11 included in the battery module 10. Details on the diagnosis of abnormal degeneration of the BMS 20 will be described later.

The switching unit 30 is a component for controlling current flow for charging or discharging of the battery module 10, and a relay or a magnetic contactor may be used. Alternatively, a semiconductor switching element such as a MOSFET may be used as the switching unit 30.

The battery pack 1 may be further communicatively connected to an external upper-level controller 2. That is, the battery pack 1 may transmit various data for the battery pack 1 to the upper-level controller 2 and receive control signals for the operation of the battery pack 1 from the upper-level controller 2. The upper-level controller 2 may be a vehicle controller for controlling the operation of the vehicle when the battery pack 1 is mounted in an electric vehicle. The upper-level controller 2 may be a rack BMS that manages a plurality of battery modules or a BMS that controls the overall operation of an energy storage device (ESS) when the battery pack 1 is used in the ESS.

Figure 2:
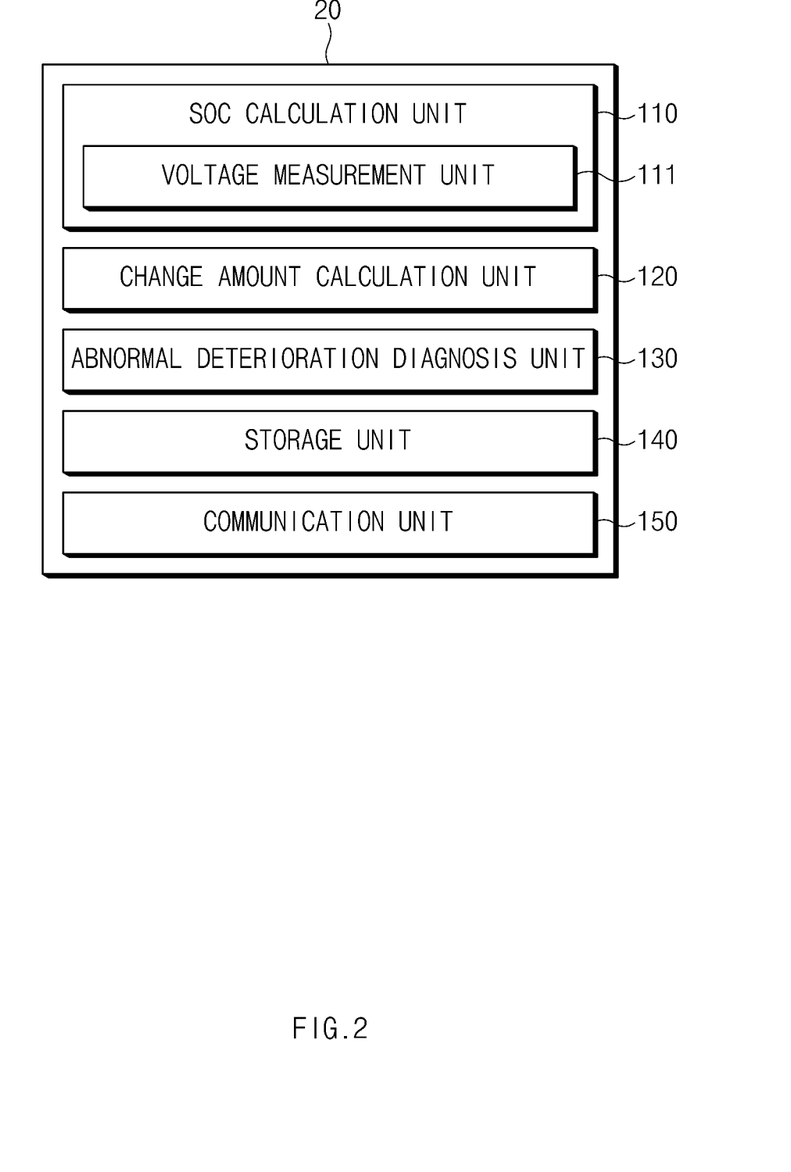
FIG. 2 is a block diagram showing functions of a battery management system according to an embodiment of the present invention.

FIG. 2 is a block diagram showing functions of a BMS 20 according to an embodiment of the present invention.

Referring to FIG. 2, the BMS 20 may include a state of charge (SOC) calculation unit 110, a change amount calculation unit 120, an abnormal deterioration diagnosis unit 130, a storage unit 140, and a communication unit 150.

The state of charge calculation unit 110 calculates the state of charge (SOC) of each of the plurality of battery cells 11. In this embodiment, the SOC calculation unit 110 may include a voltage measurement unit 111 to calculate the SOC. The voltage measurement unit 111 may be a voltage sensor that measures voltages of each of the plurality of battery cells 11 included in the battery module 10. In addition, the SOC calculation unit 110 calculates an SOC of each of the plurality of battery cells 11 based on the voltages of each of the plurality of battery cells 11 measured by the voltage measurement unit 111. In this case, the SOC calculation unit 110 may calculate an SOC based on a table (i.e., predetermined table) indicating a relationship between a voltage and an SOC. For example, the storage unit 140 may store in advance a table indicating the relationship between the voltage and the SOC, and the SOC calculation unit 110 may calculate the SOC of each of the plurality of battery cells 11 by referring to the corresponding table. However, this is an example, and in addition to using a table representing the relationship between the voltage and the SOC, various methods may be used, such as directly calculating the SOC from the voltage using a formula. In addition, in the present embodiment, it has been described that only the voltage value is used to calculate the SOC, but is not limited thereto. For example, in order to calculate the SOC, in addition to the voltage value, other parameters that affect the SOC, such as the temperature of the battery cell 11 and/or the battery pack 1, the type of the battery cell 11, and the usage time, may be additionally considered.

The SOC calculation unit 110 may monitor the plurality of battery modules 10 in real time. Accordingly, the SOC calculation unit 110 can measure the voltage value of the battery cell 11 in real time, and also calculate the SOC in real time.

The change amount calculation unit 120 calculates an SOC change amount, which is a change amount for a preset period of the SOC calculated by the SOC calculation unit 110, for each of the plurality of battery cells 11. The preset period may mean a case in which the battery pack 1 is in a standby period. That is, the change amount calculation unit 120 may calculate the SOC change amount by using the SOC calculated by the SOC calculation unit 110 during the standby period of the plurality of battery cells 11.

The change amount calculation unit 120 also calculates an average of the SOC change amount, which is an average of the SOC change amounts of all of the plurality of battery cells 11. When calculating the SOC change amount during the standby period of the plurality of battery cells 11, the change amount calculation unit 120 similarly may calculate an average of the SOC change amount for the standby period using the calculated SOC change amount.

The SOC change amount calculated by the change amount calculation unit 120 may be a change amount of the SOC due to self-discharge during the standby period of each of the plurality of battery cells 11. Also, in the same manner, the average SOC change amount calculated by the change amount calculation unit 120 may also be an average of the SOC change amount due to self-discharge during the standby period of the plurality of battery cells 11.

Meanwhile, the standby period may be set periodically. Accordingly, the change amount calculation unit 120 may repeatedly calculate the SOC change amount and the SOC change amount average for each standby period that occurs periodically. However, this is exemplary, and the standby period may be appropriately set according to the environment in which the battery pack 1 is installed, such as ESS or electric vehicle.

The abnormal deterioration diagnosis unit 130 diagnoses the abnormal deterioration of each of the plurality of battery cells 11 using the SOC change amount and SOC change amount average calculated by the change amount calculation unit 120.

As one method of diagnosing abnormal deterioration, the abnormal deterioration diagnosis unit 130 diagnoses the battery cells 11 satisfying condition) as abnormally deteriorated battery cells.

(SOC change amount/SOC change amount average)≥first reference value:  condition 1

That is, it is not simply to diagnose abnormal deterioration by directly using the SOC value, the SOH value, or the SOC change amount of each battery cell 11. In other words, the present embodiment is characterized in diagnosing abnormal deterioration using the change amount of the SOC of the battery cell 11 and the 'average of the SOC change amount'. Specifically, when the SOC change amount of the specific battery cell 11 with respect to the SOC change amount average is equal to or greater than the first reference value, it is determined that the battery cell 11 has abnormal deterioration.

As another method of diagnosing abnormal deterioration, the abnormal deterioration diagnosis unit 130 diagnoses the battery cells 11 satisfying condition2 and condition3 as abnormally deteriorated battery cells.

(SOC change amount/SOC change amount average)≥second reference value:  condition2

Period satisfying [condition2]≥reference period:  condition3

That is, when the SOC change amount of the specific battery cell 11 with respect to the SOC change amount average is equal to or greater than the second reference value and is maintained for more than the reference period, it is determined that the battery cell 11 has been abnormally deteriorated. Here, the second reference value may be a value smaller than the first reference value.

The storage unit 140 (i.e., memory) may store various programs and data necessary for the operation of the BMS 20. As described above, the storage unit 140 may store a table indicating a relationship between the SOC and the voltage for calculating the SOC of the battery cell 11. In addition, the storage unit 140 may store data such as the first reference value, the second reference value, and the reference period described above.

The communication unit 150 may transmit various information on the battery cell 11, the battery module 10 and/or the battery pack 1 to the upper-level controller 2 as necessary. Also, the communication unit 150 may receive a control signal for controlling the battery pack 1 from the upper-level controller 2. When the abnormal deterioration diagnosis unit 130 detects an abnormally deteriorated battery cell among the plurality of battery cells 11, the communication unit 150 may transmit the information to the upper-level controller 2.

Figure 3:
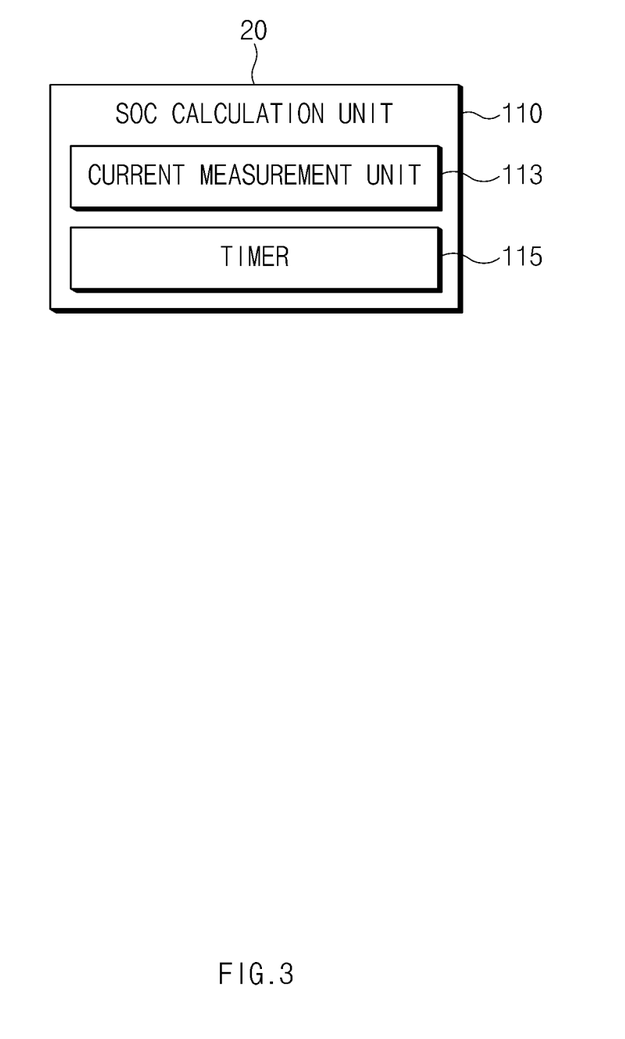
FIG. 3 is a block diagram showing the configuration of a state of charge calculation unit according to another embodiment of the present invention.

FIG. 3 is a block diagram showing the configuration of an SOC calculation unit 110 according to another embodiment of the present invention.

Referring to FIG. 3, the SOC calculation unit 110 may include a current measurement unit 113 and a timer 115 to calculate an SOC.

The current measurement unit 113 measures currents charged and discharged in the plurality of battery cells 11. The current measurement unit 113 may be a current sensor provided on a charge/discharge path of the battery pack 1.

The timer 115 measures the time during which the current is charged and discharged. That is, the timer 115 may measure a time from start to end of charging and a time from start to end of discharging of the battery pack 1, respectively.

The SOC calculation unit 110 calculates the SOC of each of the plurality of battery cells 11 based on the current measured by the current measurement unit 113 and the time measured by the timer 115. Specifically, the SOC calculation unit 110 can calculate the SOC of the battery cell 11 by integrating the measured current. In the present embodiment, it has been described that only the current value and the time are used, but the present invention is not limited thereto. For example, in order to calculate the SOC, in addition to the current value and the time, other parameters that affect the SOC, such as the temperature of the battery cell 11 and/or the battery pack 1, the type of the battery cell 11, and the usage time, may be additionally considered.

Figure 4:
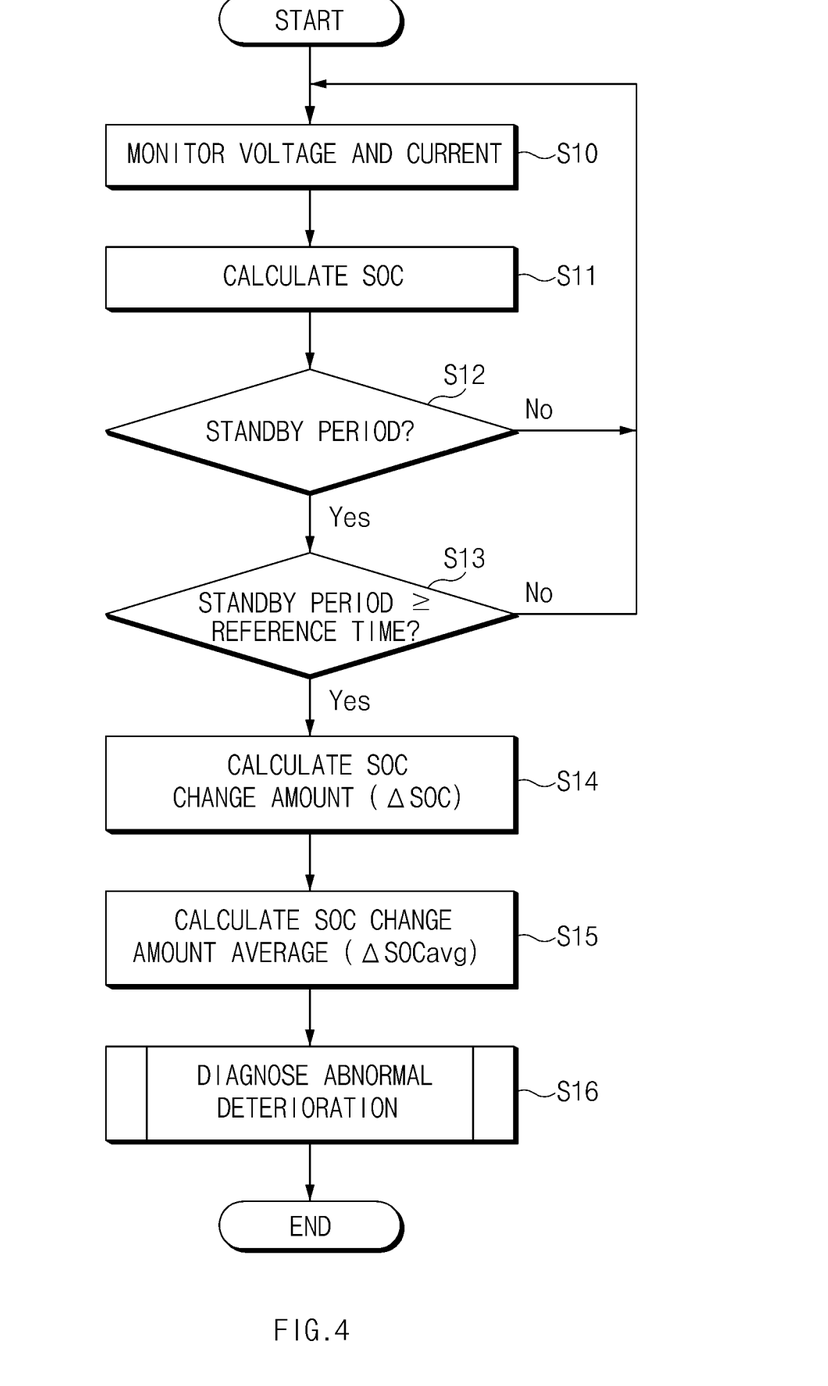
FIG. 4 is a flowchart illustrating a control method of a battery management system according to an embodiment of the present invention.

FIG. 4 is a flowchart illustrating a control method of the battery management system 20 according to an embodiment of the present invention.

Referring to FIG. 4, the BMS 20 monitors the voltage, current, and the like of the battery cell 11 and/or the battery module 10 through various sensors such as a voltage measurement unit 111 and a current measurement unit 113 (S10). The SOC calculation unit 110 calculates the SOC of each of the plurality of battery cells 11 based on the monitored values such as voltage and current, and using the above-described methods (S11). Operations S10 and S11 may be performed in real time.

Meanwhile, the BMS 20 determines whether the battery pack 1 is in a standby period while performing operations S10 and S11 (S12). The standby period may be a pause period in which charging and discharging of the battery pack 1 is not performed.

If the BMS 20 determines that the battery pack 1 is not in the standby period in operation S12, it returns to operation S10 and repeats the operations in operations S10 and S11. On the other hand, when the BMS 20 determines that the battery pack 1 is in the standby period in operation S12, it is determined whether the standby period lasts longer than the reference time (S13). The reference time may be a time at which each battery cell 11 can measure that the SOC is significantly changed by self-discharge.

When the BMS 20 determines that the standby period does not last longer than the reference time, that is, when the battery pack 1 is charged and discharged again within the reference time, the process returns to operation S10. On the other hand, if the BMS 20 determines that the standby period lasts longer than the reference time, the change amount calculation unit 120 calculates, for each of the plurality of battery cells 11, an SOC change amount $\Delta SOC$, which is a change amount of the calculated SOC during a preset period (S14). In addition, the change amount calculation unit 120 calculates the SOC change amount average $\Delta SOCavg$, which is an average of the SOC change amount $\Delta SOC$ of the entire plurality of battery cells 11 (S15).

The abnormal deterioration diagnosis unit 130 diagnoses the abnormal deterioration of each of the plurality of battery cells 11 using the SOC change amount $\Delta SOC$ and the SOC change amount average $\Delta SOCavg$ calculated in steps S14 and S15 (S16).

Hereinafter, a specific method of diagnosing abnormal deterioration of the battery cell 11 by the abnormal deterioration diagnosis unit 130 will be described.

Figure 5:
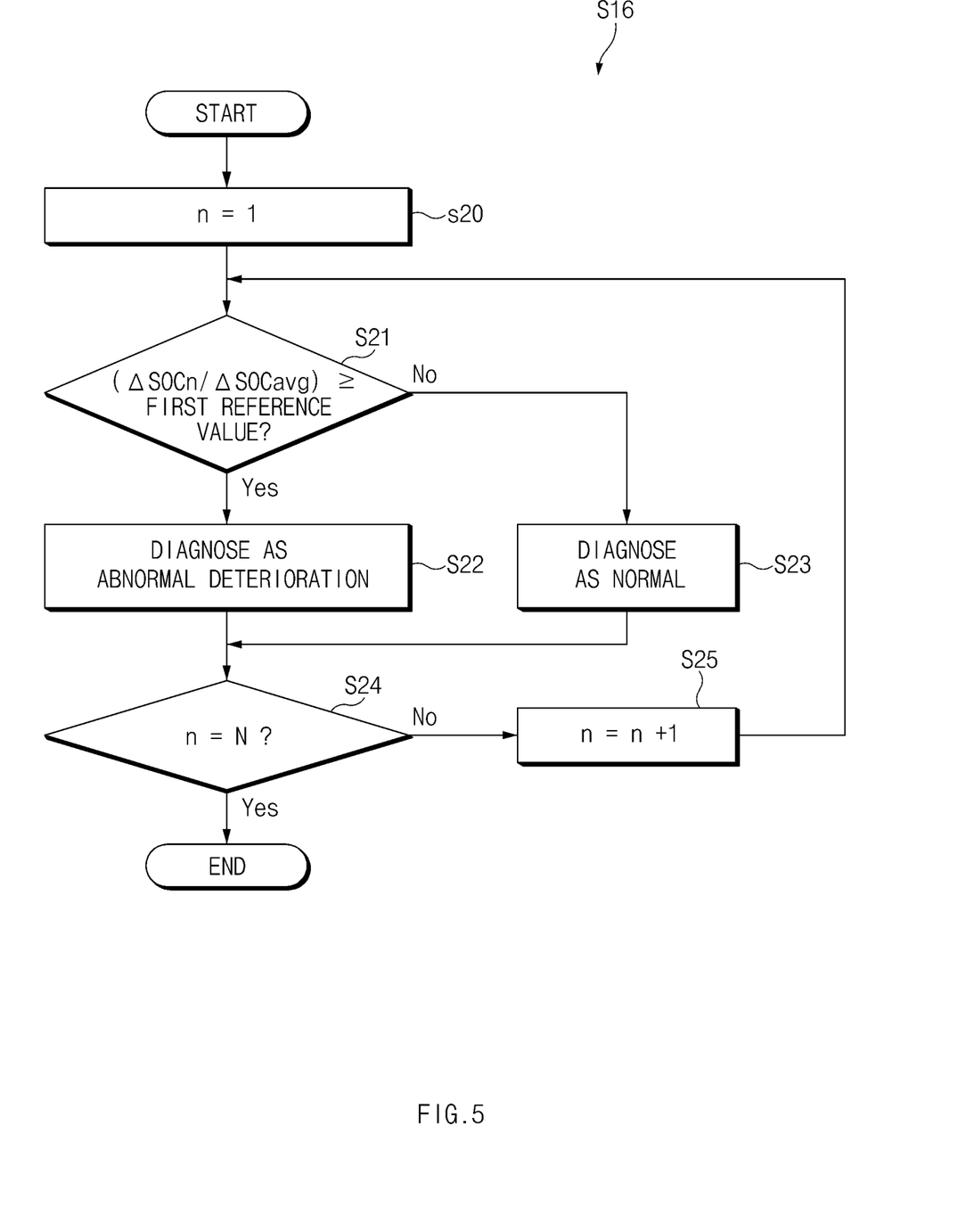
FIG. 5 is a flowchart illustrating an example of a method for diagnosing abnormal degradation in the control method of the battery management system of FIG. 4.

FIG. 5 is a flowchart illustrating an example of a method for diagnosing abnormal deterioration in the control method of the battery management system 20 of FIG. 4.

Referring to FIG. 5, as starting from the first battery cell (S20), a value obtained by dividing the calculated SOC change amount $\Delta SOCn$ of the battery cell 11 by the SOC change amount average $\Delta SOCavg$ is compared with the first reference value (S21). n represents the order of the battery cells, and it is assumed that N number of battery cells 11 are included in the battery module 10.

In operation S21, if ($\Delta SOCn/\Delta SOCavg$) is greater than or equal to the first reference value, the corresponding battery cell 11 is diagnosed as an abnormally deteriorated battery cell (S22). On the other hand, if ($\Delta SOCn/\Delta SOCavg$) is less than the first reference value in operation S21, the corresponding battery cell 11 is diagnosed as a normal battery cell (S23).

Then, it is determined whether abnormal deterioration diagnosis has been performed on all the battery cells 11 (S24). When the abnormal deterioration diagnosis is not performed on all the battery cells 11, the process proceeds to the next battery cell 11 (S25). On the other hand, when abnormal deterioration diagnosis is performed for all battery cells 11, the abnormal deterioration diagnosis is terminated. In this case, after waiting until the next standby period, the above-described operation will be repeated again when the next standby period arrives.

The abnormal deterioration of the battery cell 11 can be accurately diagnosed by the configuration of the BMS 20 and the control method thereof as described above. In this regard, the effects of the embodiments of the present invention will be described with reference to test data measured on the battery cells.

Figure 7:
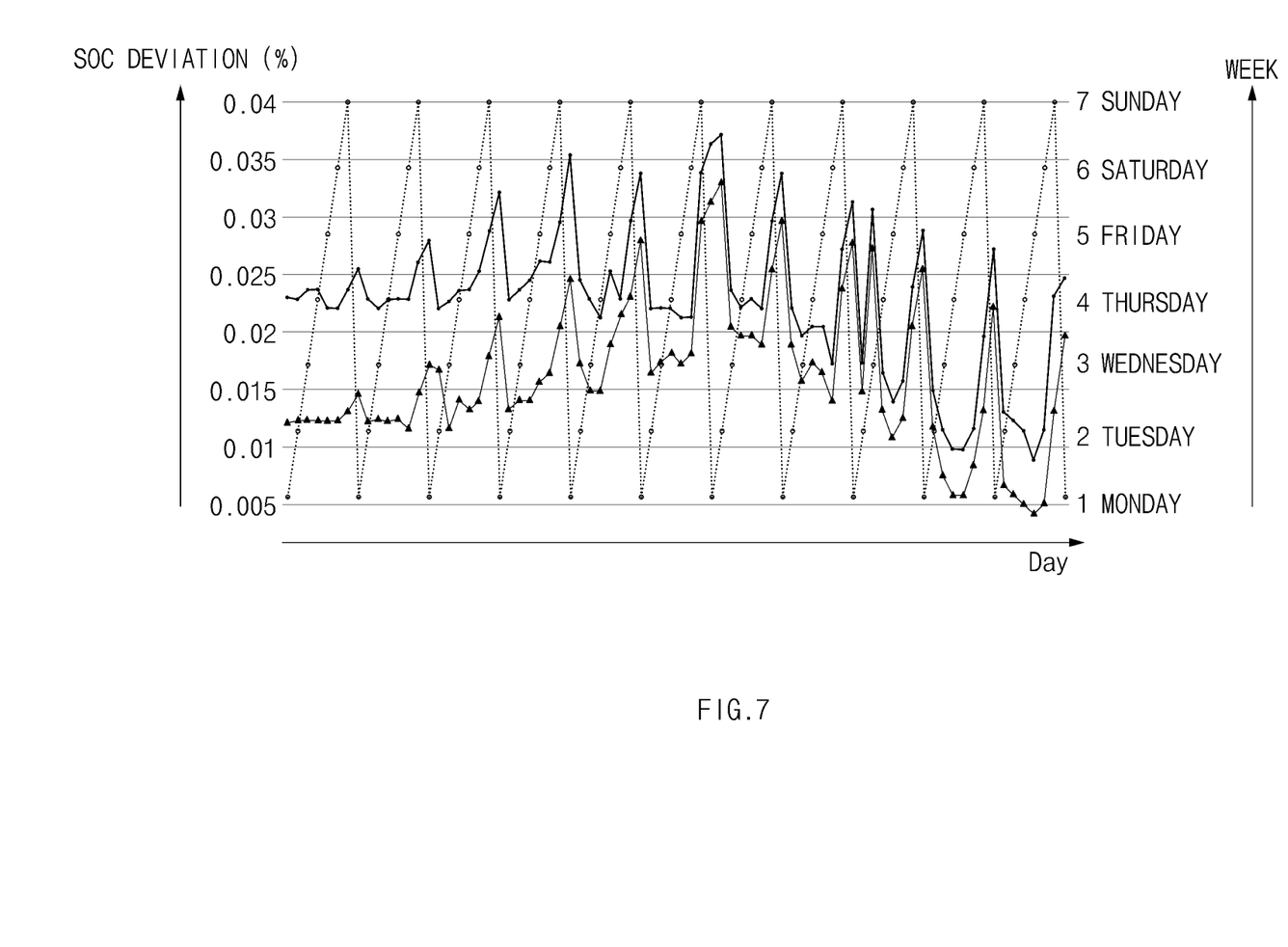
FIG. 7, FIG. 8 and FIG. 9 are graphs showing test data for battery cells.
Figure 8:
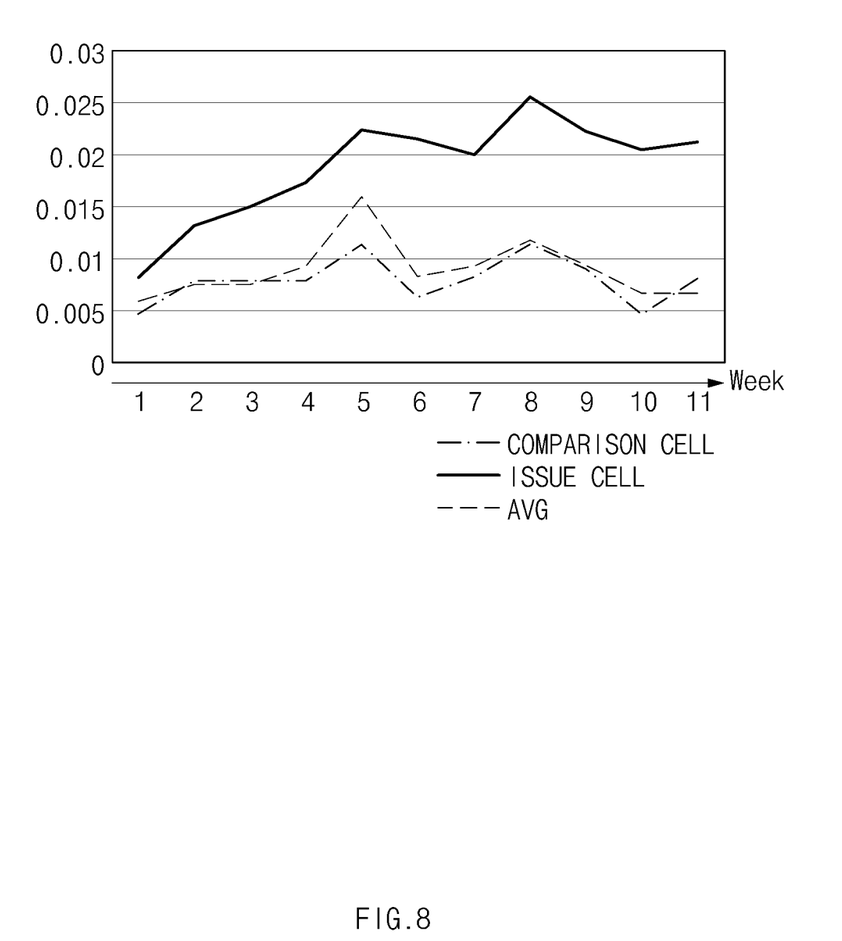
Figure 9:
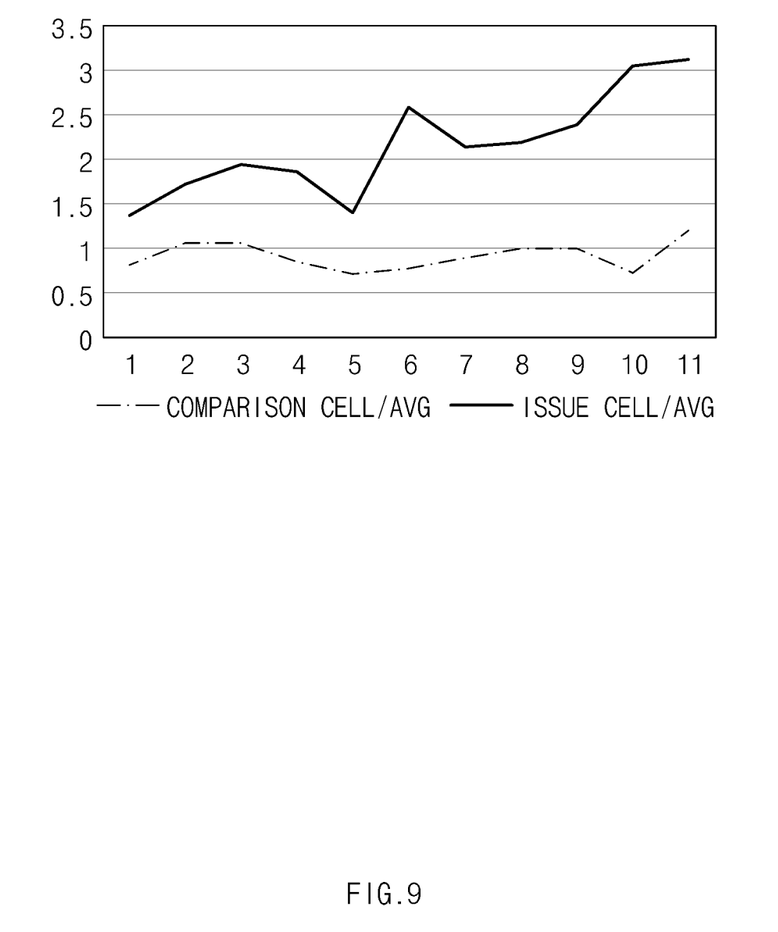

FIG. 7, FIG. 8 and FIG. 9 are graphs showing test data for battery cells.

First, FIG. 7 is illustrated based on data obtained by measuring the SOC of each battery cell in an actual battery module including a plurality of battery cells. Among them, the graph (upper graph) indicated by a circle is a graph showing the difference ($\Delta SOC(Max-Min)$) between the SOCs of the battery cells having the maximum SOC and the battery cells having the minimum SOC among battery cells. And the graph (lower graph) indicated by a triangle is a graph showing the difference ($\Delta SOC(Avg-Min)$) between the average SOC of the battery cells and the SOC of the battery cell having the minimum SOC.

In this test, the battery was maintained in a rest state from Saturday morning to Monday afternoon. That is, the battery module was not used during the weekend. And, from Monday afternoon to Saturday morning, charging and discharging were continuously performed.

Due to the above conditions, $\Delta SOC$ (Max-Min) and $\Delta SOC$ (Avg-Min) values did not increase significantly from Monday afternoon to Saturday morning. On the other hand, in the rest state from Saturday afternoon to Monday morning, it was confirmed that both $\Delta SOC$ (Max-Min) and $\Delta SOC$ (Avg-Min) values increased significantly. This is because a battery cell with a minimum SOC is a battery cell that has undergone abnormal deterioration, so the amount of self-discharge is larger than that of a normal battery cell.

However, as determined from this graph, because the values of $\Delta SOC(Max-Min)$ and $\Delta SOC(Avg-Min)$ fluctuate greatly, the values of $\Delta SOC$ (Max-Min) and $\Delta SOC$ (Avg-Min) cannot accurately determine whether a specific battery cell has abnormal deterioration. It is only possible to determine the abnormal deterioration of the battery cell only by the transition of $\Delta SOC$ (Max-Min) and $\Delta SOC$ (Avg-Min) values.

FIG. 8 shows a change amount of each battery cell itself in the rest state in the graph of FIG. 7. The determination section of the change amount is from 8 AM on Saturday to 8 AM on Monday.

Specific measurement values are as follows.

TABLE 1

| Week Cell | Comparison | Issue Cell | Avg | Comparison Cell/Avg | Issue Cell/Avg |
|---|---|---|---|---|---|
| 1 | 0.0048 | 0.0082 | 0.0059 | 0.813559322 | 1.389830508 |
| 2 | 0.008 | 0.0131 | 0.0076 | 1.052631579 | 1.723684211 |
| 3 | 0.008 | 0.0148 | 0.0076 | 1.052631579 | 1.947368421 |
| 4 | 0.008 | 0.0174 | 0.0093 | 0.860215054 | 1.870967742 |
| 5 | 0.0114 | 0.0223 | 0.0159 | 0.716981132 | 1.402515723 |
| 6 | 0.0064 | 0.0215 | 0.0083 | 0.771084337 | 2.590361446 |
| 7 | 0.0083 | 0.02 | 0.0093 | 0.892473118 | 2.150537634 |
| 8 | 0.0115 | 0.0255 | 0.0117 | 0.982905983 | 2.179487179 |
| 9 | 0.0091 | 0.0222 | 0.0093 | 0.978494624 | 2.387096774 |
| 10 | 0.0048 | 0.0204 | 0.0067 | 0.716417910 | 3.044776119 |
| 11 | 0.0081 | 0.0213 | 0.0068 | 1.191176471 | 3.132352941 |

Among the above measurement values, the issue cell is indicated by a solid line, the comparison cell is indicated by a dashed-dotted line, and the Avg is indicated by a broken line.

Looking at the graphs of FIG. 8, it was confirmed that the self-discharge increased in the rest state after the 5th week in the issue cell (i.e., abnormal deterioration cell). However, similarly, the comparison cell and Avg values also increased at the 5th week.

Therefore, there were concerns of misdiagnosis when diagnosing abnormal deterioration simply by increasing the amount of self-discharge.

FIG. 9 is a graph showing ($\Delta$SOC/$\Delta$SOCavg) values calculated and shown as described in FIGS. 2 and 5 with respect to the values in [Table 1]. In the graph of FIG. 9, the graph indicated by a solid line is a graph obtained by dividing the SOC change amount of the issue cell by the SOC change amount average, and the graph indicated by the dashed-dotted line is a graph obtained by dividing the SOC change amount of the comparison cell by the SOC change amount average.

As can be seen from the graphs of FIG. 9, in the case of the issue cell, the value rapidly increased from the 6th week. In addition, it can be seen that the value for the issue cell is greater than the value for the comparison cell over the entire period.

That is, as in the embodiments of the present invention, if the value obtained by dividing the change amount of the SOC of each battery cell by the average of the SOC change amount of all battery cells is more than a predetermined reference value, it can be immediately diagnosed as abnormally deteriorated battery cells. For example, in the case of this example, if the reference value is set to 2 and the ($\Delta$SOC/$\Delta$SOCavg) value is 2 or more, it can be diagnosed as an abnormally deteriorated battery cell. However, it will be apparent to a person skilled in the art that these reference values are only examples and may be set to other values.

According to the embodiments of the present invention, diagnosis is performed using the SOC change amount and the SOC change amount average by self-discharge in the rest state of the battery cell. Therefore, there is no need to meet specific conditions such as charging or discharging the battery cells to a specific voltage for diagnosis. In other words, it is possible to diagnose abnormal deterioration of a battery cell regardless of voltages of a plurality of battery cells. And there is no need to charge or discharge at a specific C-rate. In addition, abnormal deterioration of the battery cell is diagnosed using the SOC, not the voltage affected by the temperature and the C-rate at the end of charging/discharging.

That is, in embodiments of the present invention, it is possible to diagnose abnormal deterioration by a ratio of the change amount of the SOC in the rest state to the average of the SOC change amount regardless of charging and discharging. And by using this method, it is possible to improve the reliability of control and management of the BMS 20 by lowering the probability of false diagnosis of abnormal deterioration.

Figure 6:
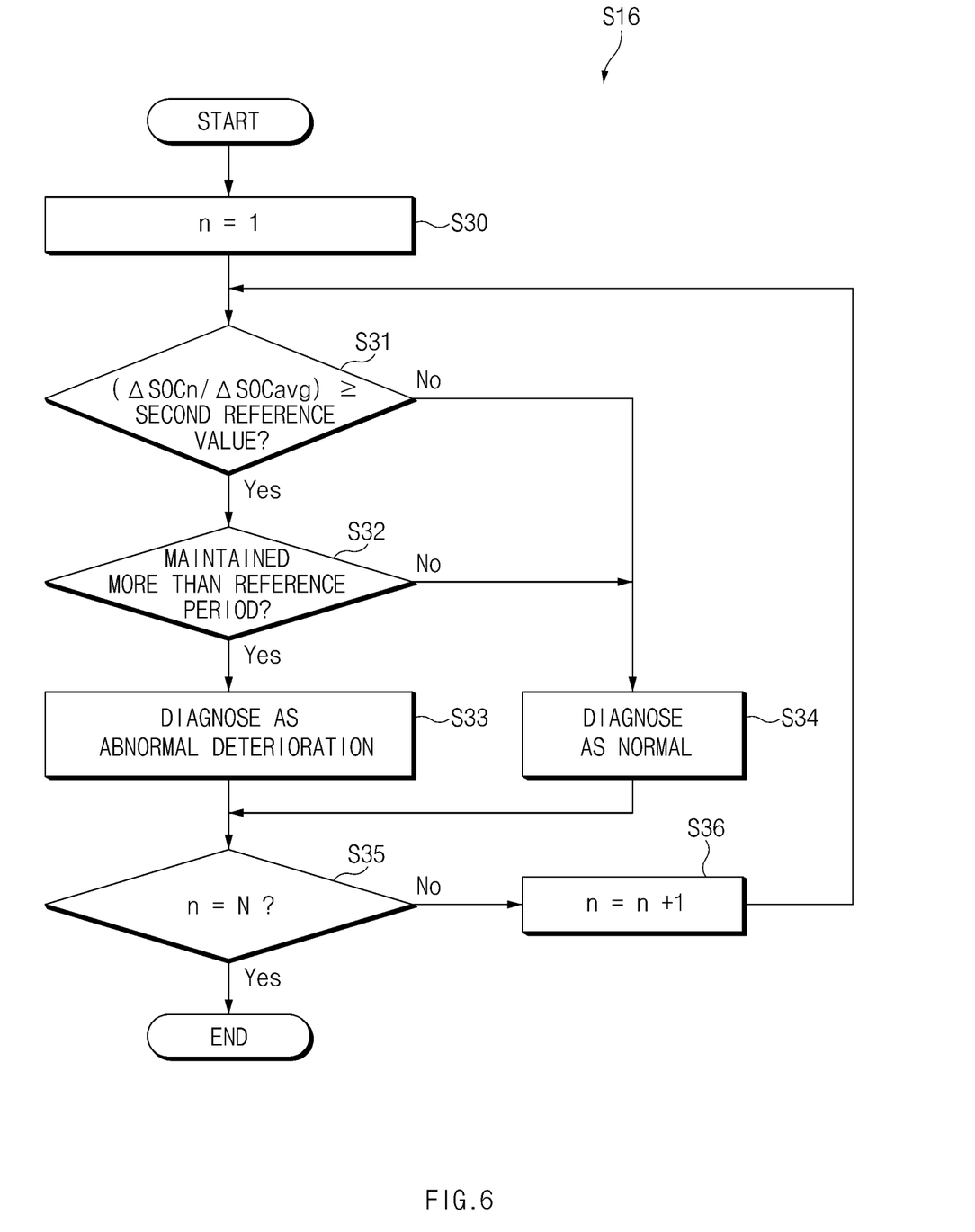
FIG. 6 is a flowchart illustrating another example of a method for diagnosing abnormal deterioration in the control method of the battery management system of FIG. 4.

FIG. 6 is a flowchart illustrating another example of a method for diagnosing abnormal deterioration in the control method of the battery management system of FIG. 4.

Referring to FIG. 6, as starting from the first battery cell (S30), a value obtained by dividing the calculated SOC change amount $\Delta$SOCn of the battery cell 11 by the SOC change amount average $\Delta$SOCavg is compared with the second reference value (S31). n represents the order of the battery cells, and it is assumed that N number of battery cells 11 are included in the battery module 10.

In operation S31, if ($\Delta$SOCn/$\Delta$SOCavg) is greater than or equal to the second reference value, it is determined whether the corresponding battery cell 11 maintains a state equal to or greater than the second reference value for more than a reference period (S32). When the state above the second reference value is maintained for longer than the reference period, the corresponding battery cell is diagnosed as an abnormally deteriorated battery cell (S33). On the other hand, if ($\Delta$SOCn/$\Delta$SOCavg) is less than the first reference value in operation S31 or less than the reference period in operation S32, the corresponding battery cell 11 is diagnosed as a normal battery cell (S34).

Then, it is determined whether abnormal deterioration diagnosis has been performed on all the battery cells 11 (S35). When the abnormal deterioration diagnosis is not performed on all the battery cells 11, the process proceeds to the next battery cell 11 (S36). On the other hand, when abnormal deterioration diagnosis is performed for all battery cells 11, the abnormal deterioration diagnosis is terminated. In this case, after waiting until the next standby period, the above-described operation will be repeated again when the next standby period arrives.

In the present embodiment, it is not determined that a battery cell is an abnormally deteriorated battery cell when ($\Delta$SOCn/$\Delta$SOCavg) of the battery cell 11 is simply more than a reference value, and it is determined that such a state is maintained for a reference period or longer. As a result, it is possible to prevent a false diagnosis in which the case where ($\Delta$SOCn/$\Delta$SOCavg) temporarily exceeds the reference value is diagnosed as abnormally deteriorated battery cells. This second reference value may be set to a lower value than the first reference value. For example, in the case of [Table 1], if the reference value is set to about 1.3, and the (ΔSOC/ΔSOCavg) value is 1.3 or higher, it can be diagnosed as abnormally deteriorated battery cells. In the case of the comparison cell, there is a case close to 1.3 (11th week), but it is temporary, so it can be expected that the value of 1.3 or more is difficult to be maintained for a certain period of time. Therefore, even if it temporarily exceeds the reference value, it is not immediately diagnosed as abnormally deteriorated battery cells, thereby preventing misdiagnosis.

Figure 10:
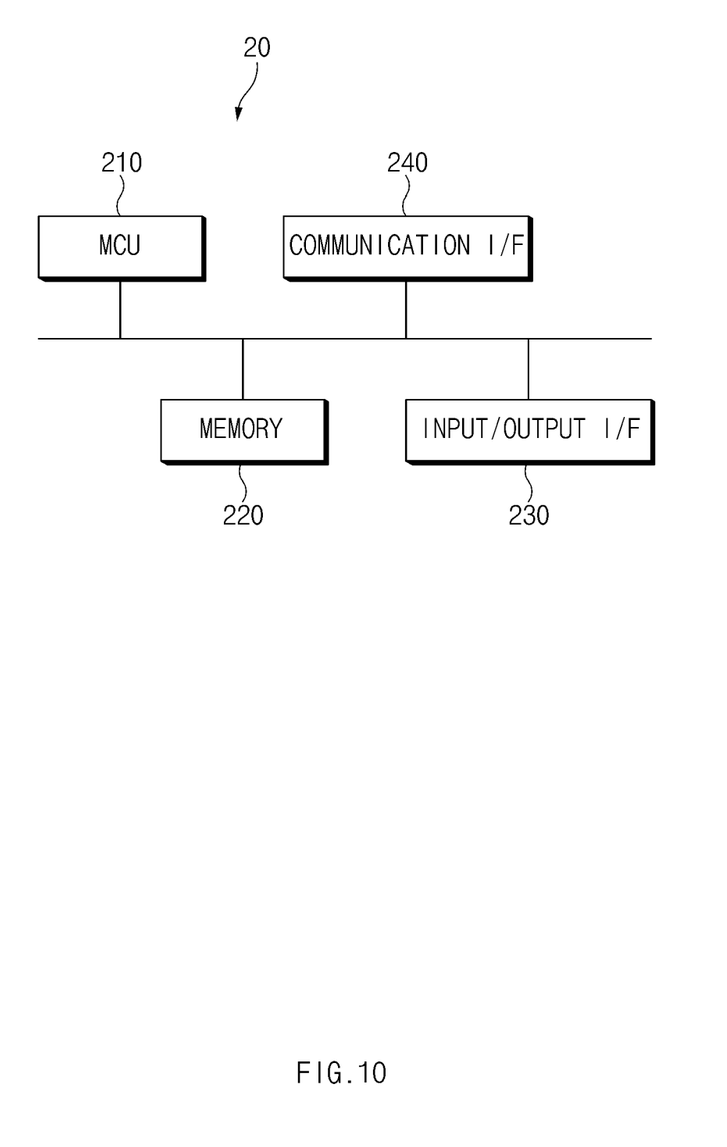
FIG. 10 is a hardware configuration diagram of a battery management system.

FIG. 10 is a hardware configuration diagram of the battery management system 20.

Referring to FIG. 10, the BMS 20 may include a controller (MCU) 210, a memory 220, an input/output interface 230, and a communication interface 240.

The MCU 210 performs processing of various operations and calculations in the BMS 20 and control of each component.

In the memory 220, an operating system program and a program for performing the functions of the BMS 20 are recorded. That is, a program describing an algorithm for performing abnormal deterioration diagnosis according to embodiments of the present invention may be stored in the memory 220. The memory 220 may include volatile memory and nonvolatile memory. For example, at least one of various storage media such as a semiconductor memory such as RAM, ROM, and flash memory, a magnetic disk, and an optical disk may be used as the memory 220. The memory 220 may be a memory built in the MCU 210 or an additional memory installed separately from the MCU 210.

The input/output interface 230 performs input/output of various input signals and output signals. For example, the MCU 210 included in the BMS 20 may receive signals from various sensors through the input/output interface 230.

The communication interface 240 is a component capable of communicating with the outside in a wired and/or wireless manner.

The MCU 210 executes a program stored in the memory 220 such that a module that performs functions of the SOC calculation unit 110, the change amount calculation unit 120, and the abnormal deterioration diagnosis unit 130 may be implemented. The memory 220 may function as the storage unit 140. The MCU 210 may operate together with the input/output interface 230 to perform functions as the voltage measurement unit 111 and the current measurement unit 113. In addition, the MCU 210 may operate with the communication interface 240 to perform a function as the communication unit 150.

In addition, the terms "include", "compose", or "have" as described above means that the corresponding component can be intrinsic, unless otherwise stated, so that it should be interpreted that other components may be further included, not excluded. All terms, including technical or scientific terms, can be interpreted as having the same meaning as generally understood by a person skilled in the art to which the present invention belongs, unless otherwise defined. Generally used terms, such as predefined terms, should be interpreted as being consistent with the contextual meaning of the related art, and are not to be interpreted in an ideal or excessively formal sense, unless explicitly defined in the present invention.

The above description is merely illustrative of the technical idea of the present invention, and those skilled in the art to which the present invention pertains will be able to make various modifications and variations without departing from the essential characteristics of the present invention. Therefore, the embodiments disclosed in the present invention are not intended to limit the technical spirit of the present invention, but to explain, and the scope of the technical spirit of the present invention is not limited by these embodiments. The scope of protection of the present invention should be construed according to the following claims, and all technical ideas falling within the scope of the same shall be construed as falling within the scope of the present invention.

The invention claimed is:

1. A battery management system (BMS) comprising:
an SOC calculation unit configured to calculate a state of charge (SOC) of a plurality of battery cells;
a change amount calculation unit configured to calculate, for each of the plurality of battery cells, an SOC, change amount that is a change amount of the calculated SOC during a preset period and an SOC change amount average that is an average of the SOC change amount of all the plurality of battery cells; and
an abnormal deterioration diagnosis unit configured to diagnose abnormal deterioration of each of the plurality of battery cells using the SOC change amount and the SOC change amount average,
wherein the abnormal deterioration diagnosis unit is further configured to:
diagnose a battery cell whose (SOC change amount/SOC change amount average) value is greater than or equal to a reference value as an abnormally deteriorated battery cell.

2. The system of claim 1, wherein the abnormal deterioration diagnosis unit diagnoses a battery cell that is maintained for more than a reference period with a (SOC change amount/SOC change amount average) value equal to or greater than the reference value as an abnormally deteriorated battery cell.

3. The system of claim 1, wherein the change amount calculation unit calculates the SOC change amount and the SOC change amount average by using the SOC calculated by the SOC calculation unit during a standby period of the plurality of battery cells.

4. The system of claim 3, wherein the abnormal deterioration diagnosis unit diagnoses whether the battery cell is abnormally deteriorated regardless of voltages of the plurality of battery cells.

5. The system of claim 3, wherein the change amount calculation unit calculates an SOC change amount due to self-discharge during the standby period as the SOC change amount.

6. The system of claim 3, wherein the change amount calculation unit periodically calculates the SOC change amount and the SOC change amount average.

7. The system of claim 1, wherein the SOC calculation unit comprises a voltage sensor for measuring a voltage of each of the plurality of battery cells, and
the SOC calculation unit calculates an SOC of each of the plurality of battery cells based on the voltage measured by the voltage sensor.

8. The system of claim 1, wherein the SOC calculation unit comprises:
a current sensor that measures a current charged and discharged in the plurality of battery cells; and
a timer that measures a time during which the current is charged and discharged, and
the SOC calculation unit calculates an SOC of each of the plurality of battery cells based on a current measured by the current sensor and a time measured by the timer.

9. A battery cell abnormal deterioration diagnosis method comprising:
calculating, by a battery management system (BMS), a state of charge (SOC) of a plurality of battery cells;

calculating, by the BMS, for each of the plurality of battery cells, an SOC change amount that is a change amount of the calculated, SOC during a preset period;

calculating, by the BMS, an SOC change amount average that is an average of SOC change amounts of all of the plurality of battery cells; and diagnosing, by the BMS, whether each of the plurality of battery cells is abnormally deteriorated using the SOC change amount and the SOC change amount average, including:

calculating a SOC change amount/SOC change amount average value;

comparing the calculated value with a first reference value; and diagnosing a battery cell, among the plurality of battery cells, whose SOC change amount/SOC change amount average value is greater than or equal to the first reference value, as an abnormally deteriorated battery cell.

10. The method of claim 9, wherein the BMS calculates the SOC change amount and the SOC change amount average during a standby period of the plurality of battery cells.

11. The method of claim 10, wherein the BMS diagnoses whether the battery cell is abnormally deteriorated regardless of voltages of the plurality of battery cells.

12. The method of claim 10, wherein the method further comprises calculating, by the BMS, an SOC change amount due to self-discharge during the standby period as the SOC change amount.

13. The method of claim 10, wherein the method further comprises periodically calculating, by the BMS, the SOC change amount and the SOC change amount average.

14. The method of claim 9, wherein the BMS comprises a voltage sensor for measuring a voltage of each of the plurality of battery cells, and wherein the method further comprises calculating, by the BMS, an SOC of each of the plurality of battery cells based on the voltage measured by the voltage sensor.

15. The method of claim 9, wherein the BMS comprises:

a current sensor that measures a current charged and discharged in the plurality of battery cells; and a timer that measures a time during which the current is charged and discharged, and wherein the method further comprises calculating, by the BMS, an SOC of each of the plurality of battery cells based on a current measured by the current sensor and a time measured by the timer.

16. A battery management system (BMS) comprising:

an SOC calculation unit configured to calculate a state of charge (SOC) of a plurality of battery cells;

a change amount calculation unit configured to calculate, for each of the plurality of battery cells, an SOC change amount that is a change amount of the calculated SOC during a preset period and an SOC change amount average that is an average of the SOC change amount of all the plurality of battery cells; and an abnormal deterioration diagnosis unit configured to diagnose abnormal deterioration of each of the plurality of battery cells using the SOC change amount and the SOC change amount average, wherein the abnormal deterioration diagnosis unit is further configured to:

diagnose a battery cell that is maintained for more than a reference period with a (SOC change amount/SOC change amount average) value equal to or greater than the reference value as an abnormally deteriorated battery cell.

* * * * *